United States Patent
Saito et al.

(10) Patent No.: US 7,828,190 B2
(45) Date of Patent: Nov. 9, 2010

(54) ULTRASONIC MOUNTING APPARATUS

(75) Inventors: Yuji Saito, Tokyo (JP); Tomomi Asakura, Tokyo (JP); Mitsuyoshi Makida, Tokyo (JP); Toru Mizuno, Tokyo (JP); Toshinobu Miyagoshi, Tokyo (JP)

(73) Assignee: TDK Corporation, Tokyo (JP)

( * ) Notice: Subject to any disclaimer, the term of this patent is extended or adjusted under 35 U.S.C. 154(b) by 0 days.

(21) Appl. No.: 12/418,926

(22) Filed: Apr. 6, 2009

(65) Prior Publication Data

US 2009/0255979 A1    Oct. 15, 2009

(30) Foreign Application Priority Data

Apr. 11, 2008  (JP) .............................. 2008-103510

(51) Int. Cl.
*B23K 1/06*   (2006.01)
*B23K 5/20*   (2006.01)
*B23K 20/10*  (2006.01)

(52) U.S. Cl. ..................................... 228/1.1; 228/110.1

(58) Field of Classification Search ............... 228/110.1, 228/1.1
See application file for complete search history.

(56) References Cited

U.S. PATENT DOCUMENTS 5,603,444 A * 2/1997 Sato ........................... 228/1.1
2003/0160084 A1 * 8/2003 Higashiyama ............... 228/1.1

FOREIGN PATENT DOCUMENTS

| JP | 2000-77480  | 3/2000  |
| JP | 2001-110850 | 4/2001  |
| JP | 2007-299967 | 11/2007 |

* cited by examiner

*Primary Examiner*—Jessica L Ward
*Assistant Examiner*—Megha Mehta
(74) *Attorney, Agent, or Firm*—Oblon, Spivak, McClelland, Maier & Neustadt, L.L.P.

(57) ABSTRACT

In an ultrasonic mounting apparatus, a pressing shaft coupled with a voice coil motor to apply a load on a part to be mounted is placed independently from components including a bonding tool, ultrasonic horn, transducer, and horn support member. The components can move coaxially with the pressing shaft which is an application axis of a driving force. Abutting position of the bonding tool and pressing shaft is brought into coincidence with a node of a standing wave generated in the bonding tool.

5 Claims, 6 Drawing Sheets

ULTRASONIC MOUNTING APPARATUS

This application claims priority from Japanese Patent Application No. 2008-103510 filed Apr. 11, 2008, which is hereby incorporated by reference herein.

BACKGROUND OF THE INVENTION

1. Field of the Invention

The present invention relates to a mounting apparatus used to mount electronic parts such as an IC chip on a substrate and, more particularly, to an ultrasonic mounting apparatus which does so-called flip-chip bonding to bond electrodes of the chip to wiring on the substrate, where the flip-chip bonding involves applying a load in a direction of the substrate to the chip while further applying ultrasonic vibration in a direction different from the direction of the load.

2. Description of the Related Art

As described, for example, in Conventional Art of Japanese Patent Application Laid-Open No. 2001-110850, conventional ultrasonic mounting apparatuses include a bracket which, being coupled with a load application axis and parallel to the application axis, supports an ultrasonic horn on an axis line away from the application axis. More specifically, the load on the chip is generated by a voice coil motor as a driving force along the axis line which coincides with the application axis. A drive shaft of the voice coil motor transmits the driving force, i.e., the load, along the axis line.

The bracket is L-shaped. Being fixed at one end of a linear portion of the L-shape extending in a direction orthogonal to the drive shaft, the bracket supports the ultrasonic horn by the other linear portion parallel to the axis line. That is, the driving force generated by the drive shaft of the voice coil motor is transmitted as a load in a direction parallel with the axis line to the ultrasonic horn via that linear portion of the L-shaped bracket which is located away from the axis line.

The ultrasonic horn receives the load from the bracket, transmits the load in a direction orthogonal to the direction of application of the load, and then transmits the load along the load application axis to a bonding tool. The bonding tool receives the applied load transmitted via the ultrasonic horn, returns the direction of application of the load to the load application axis, and transmits the load to the chip.

After the load has passed through the path described above, by keeping the load applied to the chip, the conventional technique applies ultrasonic vibration from the ultrasonic horn to the bonding tool in a direction different from that of the load application axis and thereby bonds an electrode on the chip to an electrode on the substrate.

Recently, along with complication of chip geometries resulting from the use of composite parts for chips to be mounted or with increases in the number of chip electrodes to be bonded, it has become difficult to bond the electrodes, and thus there is a demand to improve stability and strength of bonding, and so on. To meet this demand, it is most appropriate to increase the load applied for bonding.

However, as also described in Japanese Patent Application Laid-Open No. 2001-110850 (see Paragraph [0006] and FIG. 12), with a conventional cantilever-type ultrasonic horn which uses an L-shaped bracket, increases in the applied load may cause the horn and the bracket which supports the horn to bend or may generate stress in the direction of bending. This can cause the chip to tilt during mounting, resulting in misalignment of mounting position or unstable mounting of bonded electrodes. In the extreme case, the chip and the like can be damaged.

Also, bending of the bracket or generation of moment which can act as drag on the applied load may cause a difference between the driving force generated by the voice coil motor and load to be actually applied to the chip, making it difficult to control the load properly.

Japanese Patent Application Laid-Open No. 2001-110850 discloses a technique for preventing rotation moment around a fixed end of the ultrasonic horn from being applied to the chip together with the load. Specifically, pressure is applied directly to the chip via a pressure member and a bonding tool installed at the tip of the drive shaft of the motor without changing an application axis of the driving force generated by the voice coil motor. Also, to separate the moment applied by the bracket from the actual applied load, a member which supports the horn is separated from the bracket and suspended by urging means.

It is believed that the moment can be reduced to some extent when the ultrasonic horn is suspended from the bracket. However, this configuration adds to the weight of components attached to the load application axis, increasing the total weight of a driven object compared to the load required to mount the chip, making it difficult to control the load needed primarily.

Also, due to the existence of a component for exerting drag on the driving force in the object to which the driving force is applied, the load to be actually applied to a part to be mounted might not correspond exactly to the driving force. That is, the suspension, which reduces the moment, can destabilize size and directionality and thereby generate additional uncertain factors which can affect the load actually needed.

Besides, Japanese Patent Application Laid-Open No. 2000-077480 discloses a configuration in which a driving force generated by a voice coil motor is received once by a load base, which then applies a load directly to a bonding tool. Since driving force is applied equally to a bracket and the bonding tool via the load base, this configuration prevents generation of the above-described moment itself.

However, again, due to the existence of a component for exerting drag on the driving force in the object to which the driving force is applied, the load to be actually applied to a part to be mounted might not correspond exactly to the driving force. That is, since the configuration adds to the weight of an object which receives the load from the voice coil motor, the load to be actually applied to the chip becomes too small compared to the generated driving force, making it difficult to control the load needed primarily.

SUMMARY OF THE INVENTION

The present invention has been made in view of the above-described circumstances and has an object to provide an ultrasonic mounting apparatus which can reduce generation of moment which can be imposed on a bonding tool and reduce components subjected to a load directly by a voice coil motor serving as load generating means, and thereby allows a load applied to a chip to be adjusted finely.

To solve the above problem, the present invention provides an ultrasonic mounting apparatus which bonds an electrode of an electronic part to be mounted to a wiring electrode on a substrate by pressing the electrode against the wiring electrode with a load applied along a predetermined application axis and applying ultrasonic vibration to the electrode, the ultrasonic vibration having a directional component different from the predetermined application axis, comprising: a bonding tool which, being placed along the predetermined application axis, supports the electronic part at a lower end along the predetermined application axis; a transducer which generates the ultrasonic vibration; an ultrasonic horn which, extending in a direction different from the direction of the predetermined application axis, holding the bonding tool at one end, and being connected to the transducer at the other end, transmits the ultrasonic vibration to the bonding tool; a horn support member which supports the ultrasonic horn; bearing means which supports components including the horn support member, the ultrasonic horn, the transducer, and the bonding tool as integral components in conjunction with the horn support member and allows movement of the components only in a direction along the predetermined application axis; driving means which generates a driving force along the predetermined application axis; and a pressing shaft which, extending along the predetermined application axis and being connected at one end to the driving means, abuts the other end against an upper end of the bonding tool and presses the bonding tool independently of the components and thereby transmits the driving force generated by the driving means to the bonding tool, wherein a contact point between the upper end of the bonding tool and the pressing shaft is located at a node of a standing wave generated from the ultrasonic vibration transmitted to the bonding tool.

Preferably, the ultrasonic mounting apparatus further comprises urging means which produces drag so as to counteract gravity acting on the components. Preferably, the ultrasonic mounting apparatus further comprises locking means which can temporarily restrict movement of the components along the predetermined application axis. Preferably, in the ultrasonic mounting apparatus, the horn support member comprises a cylindrical region extending in the direction of the predetermined application axis around the predetermined application axis; and the bearing means is a direct-acting (linear or linear-motion) bearing which supports an outer periphery of the cylindrical region.

The present invention makes it possible to apply a load directly to the chip along an axis line of the bonding tool by reducing bending of the ultrasonic horn, a bracket, and the like as well as reducing the moment even when the load applied to the chip increases. Also, the present invention makes it possible to directly apply the driving force of a voice coil motor serving as load generating means to the chip which is a part to be mounted, by counteracting the weight of members including the member which supports the ultrasonic horn.

Thus, combined with the reduction in the effect of the moment described above, the present invention makes it possible to finely adjust the load applied to the chip. Furthermore, by eliminating a component for exerting drag on the driving force from the objects to which the load is applied, the present invention makes it possible to easily and accurately control the load applied to the chip.

The above and other objects, features, and advantages of the invention will become more apparent from the following detailed description taken in conjunction with the accompany drawings.

DESCRIPTION OF THE PREFERRED EMBODIMENTS

Figure 1:
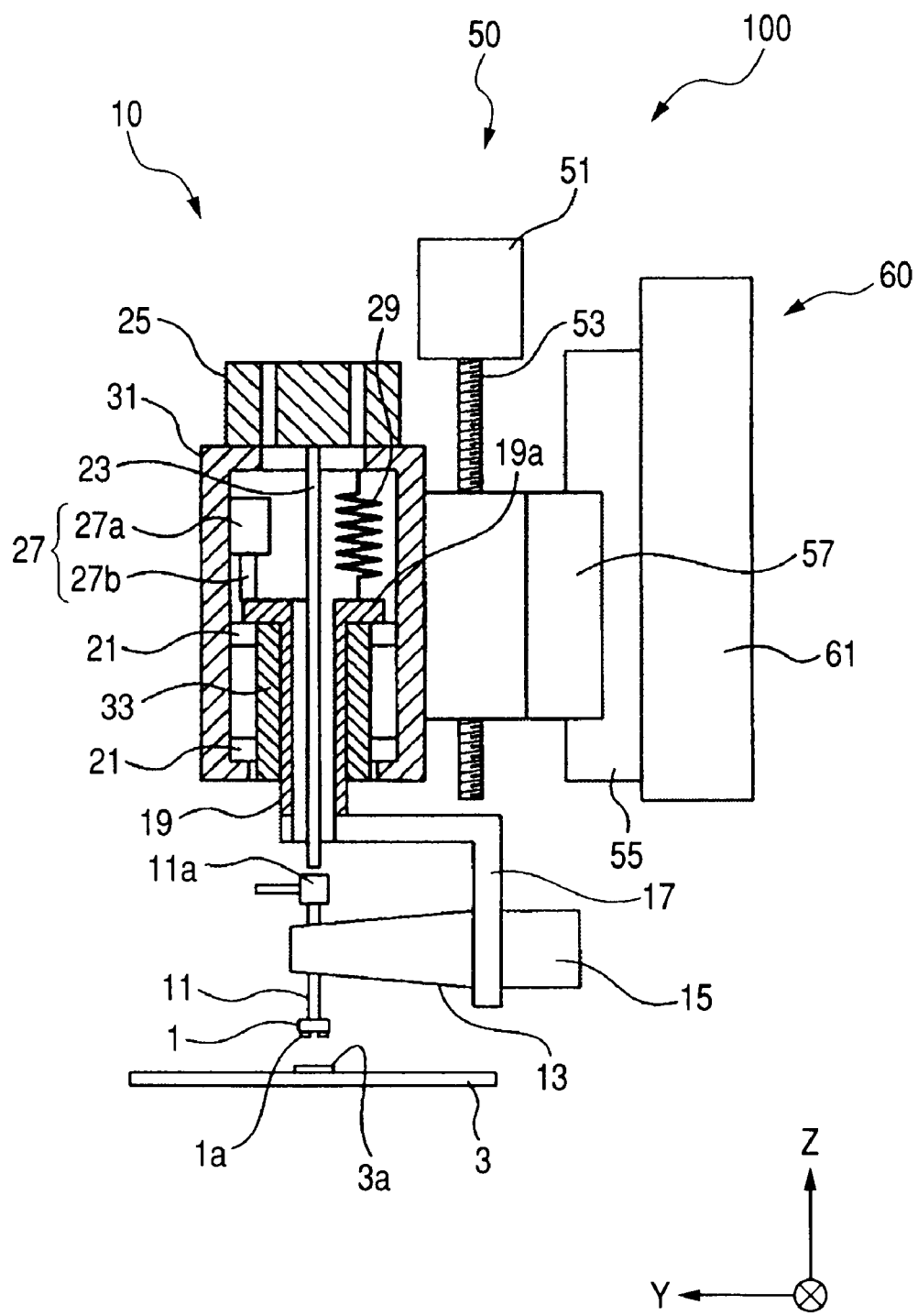
FIG. 1 is a side view of principal part, showing schematic configuration of a mounting apparatus according to a first embodiment of the present invention.

Embodiments of the present invention will be described below with reference to the drawings. FIG. 1 is a schematic side view of principal part including a partial sectional view of an ultrasonic mounting apparatus according to an embodiment of the present invention. The ultrasonic mounting apparatus 100 according to the present embodiment includes a mounting head body 10, Z-axis body driving means 50, and X-axis driving means 60. The Z-axis body driving means 50 includes a body drive motor 51, a ball screw 53, a Z-axis guide rail 55 and, a Z-axis slider 57. The mounting head body 10 is fixed to the Z-axis slider 57, which in turn is supported by the Z-axis guide rail 55 slidably in a Z-axis direction and engaged with the ball screw 53. The body drive motor 51 rotates the ball screw 53 around an axis. As the ball screw 53 rotates, the Z-axis slider 57 slides along the Z-axis guide rail 55. The Z-axis guide rail 55 is supported by an X-axis slider 61 of the X-axis driving means 60. The X-axis slider 61 (X-axis driving means 60) is made up of a single-axis drive mechanism which includes a known ball screw.

The mounting head body 10 includes a bonding tool 11, an ultrasonic horn 13, a transducer 15, a horn support member (described above) 17 which is an L-shaped bracket, a turning member 19, a pair of rotary bearings 21, a pressing shaft 23 which is a drive shaft, driving means 25 exemplified by a voice coil motor, locking means 27, urging means 29 which suspends the horn support member, a slide block 31, and a direct-acting bearing 33. The slide block 31 is supported directly by the Z-axis slider 57 and structured as a casing or frame having a vertical through-hole (in the Z-axis direction which corresponds to drive direction of the driving means). The driving means 25 is placed on top of the slide block 31, and the pressing shaft 23 whose upper end is coupled to the driving means 25 extends downward in the Z-axis direction from out of the slide block 31 through the vertical through-hole in the slide block 31.

The bonding tool 11 is approximately pipe-shaped in structure and is placed coaxially with the pressing shaft 23 in such a way as to extend in the Z-axis direction. The bonding tool 11 has an evacuation port 11a which is communicated with an evacuation system (not shown) at an upper end and holds a to-be-mounted part 1 such as an IC chip by suction at an opening at a lower end. The ultrasonic horn 13 is an approximately conical member whose axial center is placed in such a way as to extend in a Y-axis direction orthogonal to the Z-axis direction. The ultrasonic horn 13 is coupled with the bonding tool 11 at a tapered tip, holding the bonding tool 11. Also, the ultrasonic horn 13 is coupled at a rear end with the transducer 15 which generates ultrasonic vibration. The ultrasonic vibration generated by the transducer 15 is imparted to the ultrasonic horn 13 and transmitted to the bonding tool 11, being amplified progressively due to shape effect during its travel toward the tip. The transmitted ultrasonic vibration is a vibration in the Y-axis direction orthogonal to the Z-axis direction and is transmitted to a lower electrode 1a of the to-bemounted part 1 via the bonding tool 11. The ultrasonic vibration is applied, with the lower electrode 1a pressed to an electrode 3a on a target substrate 3 under a predetermined applied load, and consequently the electrodes are bonded.

As described above, the horn support member 17 has an L-shape extending in a YZ plane (plane parallel to the plane of the paper). The horn support member 17 supports rear part of the ultrasonic horn 13 by an end (the lower end in the Z-axis direction) of one linear portion. An end of the other linear portion of the horn support member 17 extending in the Y-axis direction is coupled to the lower end of the turning member 19 in the Z-axis direction. The turning member 19 is a cylindrical member which extends in the Z-axis direction, being placed coaxially with the pressing shaft 23. The turning member 19 is supported by the direct-acting bearing 33 in such a way as to be slidable in the Z-axis direction, where the direct-acting bearing 33 similarly extends in the Z-axis direction, being placed coaxially. Extending in the Z-axis direction, the direct-acting bearing 33 is supported at the upper and lower ends by the slide block 31 via the rotary bearings 21 in such way as to be rotatable in the Z-axis direction (around an axial center of the pressing shaft 23). Also, the turning member 19 is supported by the slide block 31 via the urging means 29. The urging means 29, which is, for example, a spring, is configured to give the turning member 19 an urging force in a direction opposite the gravity acting on the turning member 19 and intended to counteract the gravity acting on the turning member 19, horn support member 17, transducer 15, ultrasonic horn 13, and bonding tool 11. According to the present invention, components including the horn support member 17, transducer 15, ultrasonic horn 13, and bonding tool 11 function as integral components which counteracts gravity using drag (described below) exerted by the urging means 29.

The mounting head body 10 is driven in the X-axis direction and the Z-axis direction with the to-be-mounted part 1 being held by suction using X-axis driving means and Z-axis driving means. In this case, when the components ranging from the turning member 19 to the bonding tool 11 are kept substantially free of gravity as described above, the individual components may behave unexpectedly by reason of their inertia at the time of the drive operation. From the viewpoint of preventing such unexpected behavior, the present embodiment uses the locking means 27. The locking means 27 includes an air cylinder 27a and a cylinder pin 27b connected to the air cylinder 27a and configured to be extendable. The cylinder pin 27b can abut a flange 19a which, being formed on top of the turning member 19, spreads outward. The cylinder pin 27b pinches the flange 19a in conjunction with the upper one of the rotary bearings 21 to secure the turning member 19 to the slide block 31. A component for air supply and evacuation is annexed to the air cylinder 27a, but omitted from illustration for simplicity.

When vertical ultrasonic vibration in the Y-axis direction is transmitted to the bonding tool 11 via the ultrasonic horn 13, a so-called standing wave (lateral vibration when viewed in the direction of transmission of the ultrasonic vibration) is generated around a joint between the bonding tool 11 and ultrasonic horn. To bond electrodes using ultrasonic vibration effectively, preferably the electrode 1a of the to-be-mounted part 1 is placed at an antinode where the standing wave has maximum amplitude. Thus, distance from the joint between the bonding tool 11 and ultrasonic horn 13 to the electrode 1a of the to-be-mounted part 1 held by the bonding tool 11 is designed to satisfy this condition based on the period of the standing wave. If the upper end of the bonding tool 11 to about the lower end of the pressing shaft 23 is located at the antinode of the standing wave described above, the pressing shaft 23 and the bonding tool 11 cannot abut each other in a stable manner. Also, when viewed microscopically, the upper end of the bonding tool 11 repeats up-and-down movements, even exerting drag on the load. Therefore, the present invention ensures that the upper end of the bonding tool 11 will be placed at a node of the standing wave to make the pressing shaft 23 and bonding tool 11 abut each other in a stable manner. This configuration makes it possible to minimize the possibility of drag being produced by the bonding tool 11 and thereby transmit the load from the pressing shaft 23 more reliably and stably.

Next, description will be given of operation performed by various components when the ultrasonic mounting apparatus 100 according to the present embodiment actually mounts the to-be-mounted part 1 on the substrate 3. In a mounting process, the mounting head body 10 is transported by the Z-axis body driving means 50 and X-axis driving means 60 to a supply point of the to-be-mounted part 1. The locking means 27 pinches the flange 19a in conjunction with the rotary bearings 21 and thereby restricts unexpected movements of the turning member 19, horn support member 17, transducer 15, ultrasonic horn 13, and bonding tool 11. After holding the to-be-mounted part 1 by suction at the tip of the bonding tool 11, the mounting head body 10 is transported by the Z-axis body driving means 50 and X-axis driving means 60 to a predetermined position above the substrate 3 driven to a predetermined position by a substrate transport system (not shown) which transports the substrate in the Y-axis direction. While the to-be-mounted part 1 is being transported to above the substrate 3, an image processing system (not shown) calculates position of the substrate, deviation of the substrate from predetermined X and Y axes, holding posture of the to-be-mounted part 1, and the like and thereby finds total deviation from the posture to be assumed by the to-be-mounted part 1 during bonding. When the mounting head body 10 is lowered by the Z-axis body driving means, the holding posture is corrected by means of position correction in the XY plane performed by the respective driving means and theta correction performed by a theta drive system (not shown) by turning the turning member 19.

When a sensor (not shown) detects that the electrode 1a of the to-be-mounted part 1 has lowered to a predetermined height located just above a position where the electrode 1a abuts the electrode 3a on the substrate 3, the locking means 27 releases the turning member 19. The to-be-mounted part continues to lower further until the to-be-mounted part 1 abuts the substrate 3. Impact of the abutment between the to-be-mounted part 1 and substrate 3 is reduced greatly by the urging means 29. Consequently, the electrode 1a of the to-be-mounted part 1 is brought into abutment with the electrode 3a on the substrate 3 almost under no-load conditions. Then, the driving means 25 drives the pressing shaft 23 anew and thereby makes the lower end of the pressing shaft 23 abut the upper end of the bonding tool 11 to apply a predetermined load to the to-be-mounted part 1 via the bonding tool 11. With the predetermined load applied to the to-be-mounted part 1, the transducer 15 applies ultrasonic vibration to the bonding tool 11 via the ultrasonic horn 13 to bond the electrode 1a of the to-be-mounted part 1 and electrode 3a on the substrate to each other.

As described above, according to the present invention, since the series of components which generate and transmit ultrasonic vibration to the bonding tool 11 and support components thereof (turning member 19, horn support member 17, transducer 15, ultrasonic horn 13, and bonding tool 11) are configured to be independent of the mounting head body 10 using the direct-acting bearing 33, the components related to ultrasonic vibration can be operated almost independently of the components which apply the load. This makes it possible to solve the problems with the conventional techniques, i.e., bending of the L-shaped bracket and rotation moment acting on the ultrasonic horn, which can occur as the load increases. Furthermore, the present invention makes it possible to almost cancel the gravity acting on the components related to the ultrasonic vibration by suspending the components from the slide block 31 via the urging means 29 and thereby apply a load to the to-be-mounted part 1 using the driving means 25 with the gravity almost canceled. Thus, the load actually applied is approximately equivalent to the driving force, which makes it possible to fine tune the driving force after grasping the magnitude of the actual load.

Incidentally, although in the above embodiment, the urging means 29 is illustrated as having a spring-like structure which is held in the slide block 31, the urging means 29 is not limited to the illustrated form. As long as the urging means 29 can counteract the gravity acting on the turning member 19, horn support member 17, transducer 15, ultrasonic horn 13, and bonding tool 11 as described above, the urging means 29 may be a spring or other member made of an elastic material such as rubber or a fluid cylinder, motor, or the like which actually applies a driving force to the components. Also, the urging means 29 may be placed outside the slide block 31. Besides, according to the present embodiment, the direct-acting bearing 33 allows the turning member 19 and slide block 31 to operate independently of each other. However, as long as the movement of the turning member 19 in the XY plane can be restricted and operation in the Z-axis direction can be separated, various components which can be defined as bearing means are available as alternatives to the direct-acting bearing 33. Regarding the locking means 27, other components may be used as long as they can restrict displacement of the series of components, including the turning member 19, horn support member 17, transducer 15, ultrasonic horn 13, and bonding tool 11, from the slide block 31. That is, a typical actuator used for electric driving, a piezo element, or the like may also be used.

Figure 2:
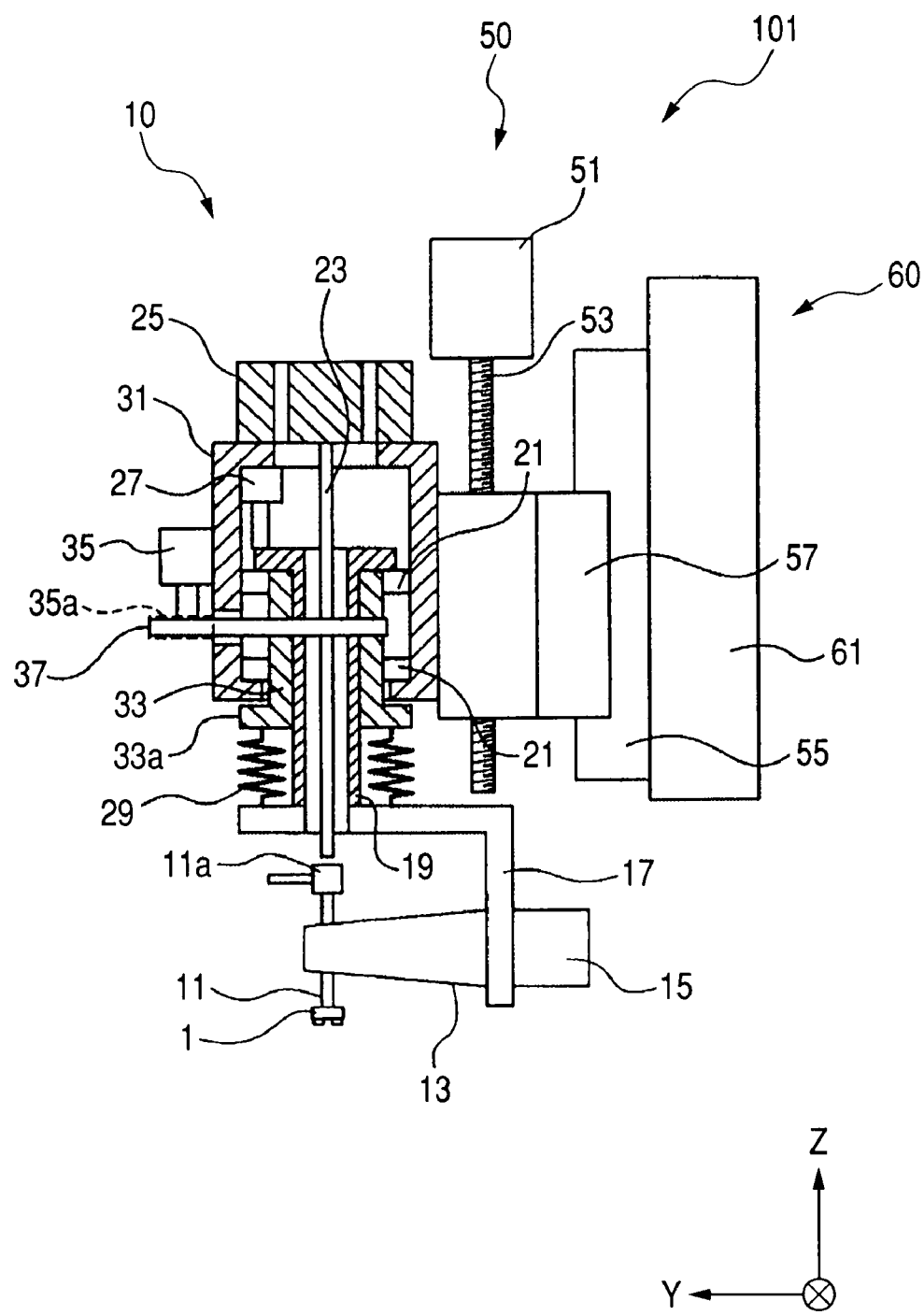
FIG. 2 is a side view of principal part, showing schematic configuration of a mounting apparatus according to a second embodiment of the present invention.

A more concrete second embodiment of the present invention will be described next. FIG. 2 shows an ultrasonic mounting apparatus 101 according to the second embodiment in the same format as in FIG. 1. Incidentally, in the present embodiment, components which operate in the same manner as corresponding components of the first embodiment are only indicated in the figure by reference numerals and detailed description thereof will be omitted. Only components different from those of the first embodiment will be described in detail. Also, the condition regarding the length of the bonding tool prescribed in relation to the standing wave in the first embodiment applies as it is to the present embodiment. According to the present embodiment, a bearing flange 33*a* which spreads outward is formed at the lower end of the direct-acting bearing 33 in the Z-axis direction. That end of the linear portion of the L-shaped horn support member 17 which is coupled to the turning member 19 is extended further, forming a region right opposite the bearing flange 33*a*. The urging means 29 is placed between the bearing flange 33*a* and that region of the horn support member 17 which is located right opposite the bearing flange 33*a*. A rotary motor 35, pulley 35*a*, and timing belt 37 are newly installed to actually turn the turning member 19, where the pulley 35*a* is coupled to a rotating shaft of the rotary motor 35 and the timing belt 37 is suspended between the pulley 35*a* and a pulley (not shown) formed on an outer periphery of the direct-acting bearing 33. The use of the new components enables rotation around an axis of the turning member 19, i.e., the bonding tool 11 integrated with the turning member 19, making it possible to perform theta correction of the to-be-mounted part 1.

According to the present embodiment, the urging means 29 is placed between the slide block 31 and horn support member 17. This complicates components located below the slide block 31. However, the present embodiment allows the urging means 29 to rotate together with the turning member 19. Thus, unlike the first embodiment, effects of unnecessary loads on the urging means 29 caused by torsion can be eliminated, making it possible to more precisely control the electrodes to be bonded.

Figure 3:
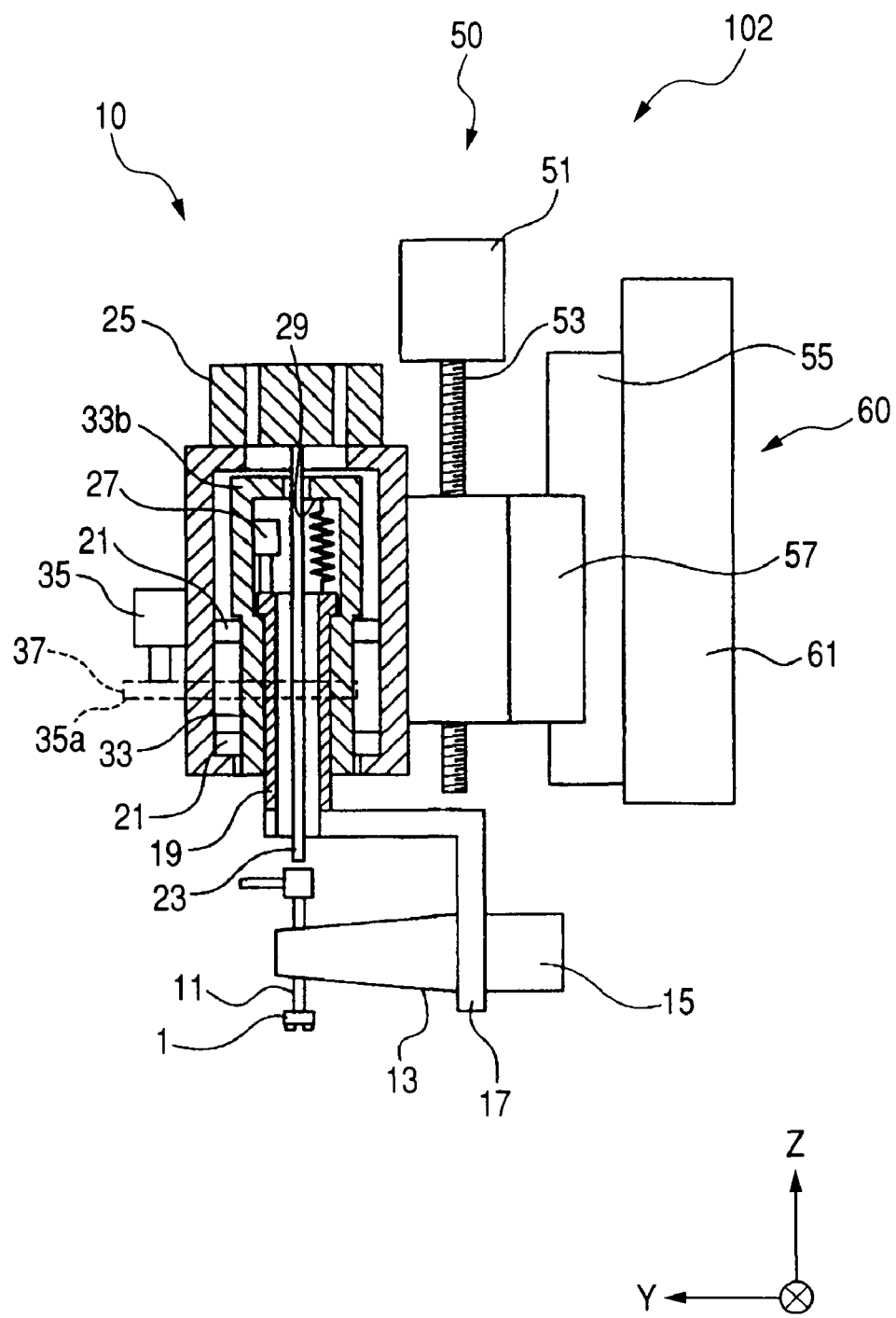
FIG. 3 is a side view of principal part, showing schematic configuration of a mounting apparatus according to a third embodiment of the present invention.

A third embodiment of the present invention will be described next. FIG. 3 shows an ultrasonic mounting apparatus 102 according to the third embodiment in the same format as in FIG. 1. Incidentally, in the present embodiment, components which operate in the same manner as corresponding components of the first embodiment are only indicated in the figure by reference numerals and detailed description thereof will be omitted. Only components different from those of the first or second embodiment will be described in detail. Also, the condition regarding the length of the bonding tool prescribed in relation to the standing wave in the first embodiment applies as it is to the present embodiment. According to the present embodiment, the rotary motor 35, pulley 35*a*, and timing belt 37 are installed as with the second embodiment. Besides, the direct-acting bearing 33 is extended into inner space of the slide block 31 with a cylindrical auxiliary member 33*b* attached. The urging means 29 and locking means 27 are housed in inner space of the auxiliary member 33*b*. One end of the urging means 29 is coupled to the auxiliary member 33*b* and the other end is coupled to the turning member 19. The locking means 27 is also coupled to the auxiliary member 33*b* to restrict movement of the turning member 19 in the Z-axis direction as required.

According to the present embodiment, since the auxiliary member 33*b* and locking means 27 are added to the objects driven at the time of theta correction, it is necessary to increase the torque of the rotary motor 35 slightly. Also, the present embodiment has a drawback in that the addition of the auxiliary member 33*b* and the like complicates structure. However, the present embodiment makes it possible to reduce the total weight of the objects handled by the locking means 27 and weight of the objects suspended by the urging means 29 compared to the first embodiment, increase the range of components to choose from when building the locking means 27 and urging means 29, and achieve effect at low torque, and thereby makes it possible to perform fine control. Also, since the locking means 27 and urging means 29 rotate together with the direct-acting bearing 33 and turning member 19 via the auxiliary member 33*b*, the turning member 19 being engaged with the direct-acting bearing 33, effects of unnecessary loads on the urging means 29 caused by torsion can be eliminated, making it possible to more precisely control the electrodes to be bonded, as in the case of the second embodiment.

Figure 4:
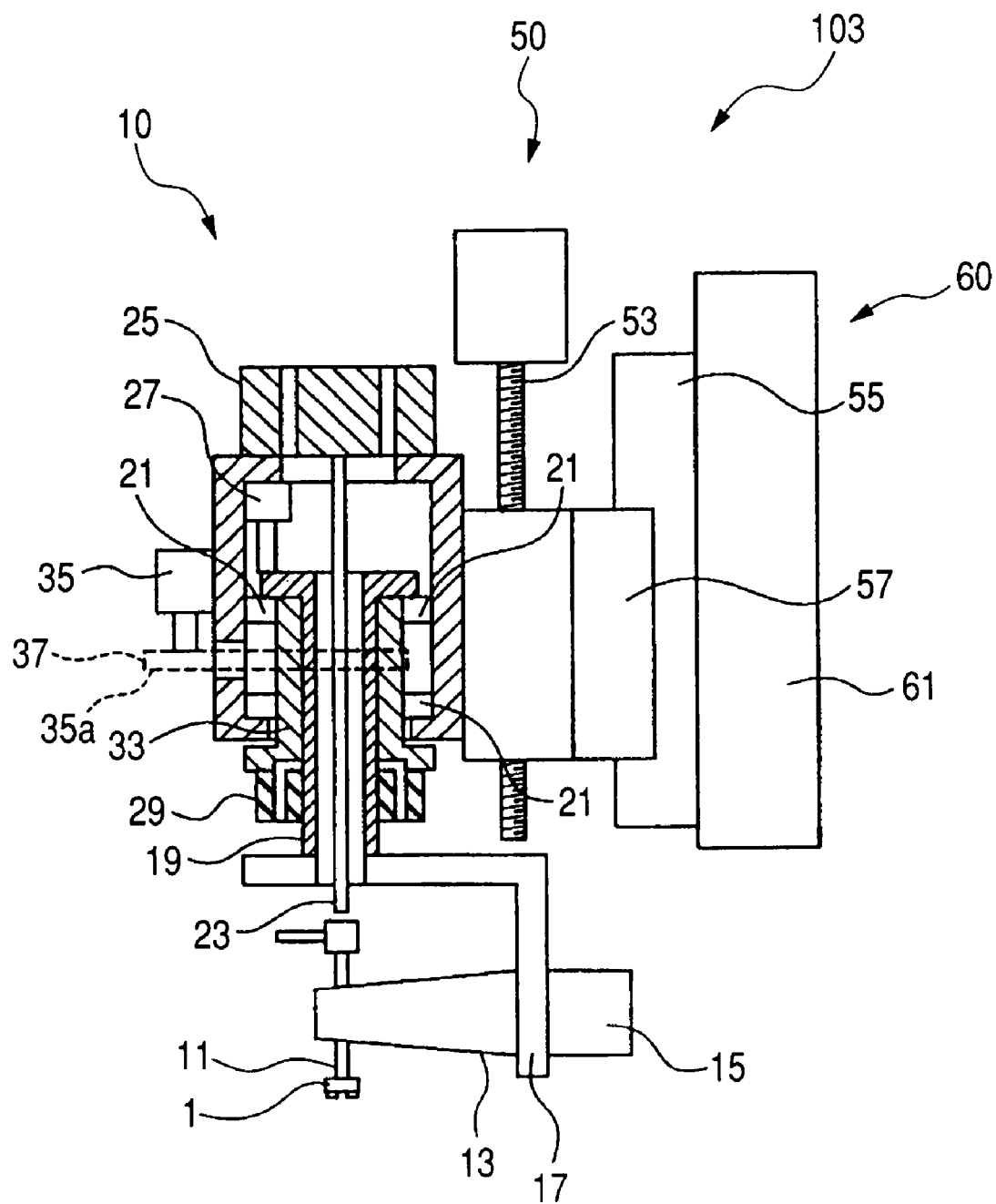
FIG. 4 is a side view of principal part, showing schematic configuration of a mounting apparatus according to a fourth embodiment of the present invention.

A more concrete fourth embodiment of the present invention will be described next. FIG. 4 shows an ultrasonic mounting apparatus 103 according to the fourth embodiment in the same format as in FIG. 1. Incidentally, in the present embodiment, components which operate in the same manner as corresponding components of the first embodiment are only indicated in the figure by reference numerals and detailed description thereof will be omitted. Only components different from those of the first to third embodiments will be described in detail. Also, the condition regarding the length of the bonding tool prescribed in relation to the standing wave in the first embodiment applies as it is to the present embodiment. According to the present embodiment, urging means 29 equivalent to the one according to the second embodiment is constructed using a voice coil motor. The use of the voice coil motor as the urging means 29 makes it possible to accurately counteract the gravity acting on the turning member 19, horn support member 17, transducer 15, ultrasonic horn 13, and bonding tool 11. That is, the use of the voice coil motor as the urging means 29 offers greater advantages in controllability although the present embodiment is slightly inferior to the second embodiment in terms of followability.

Figure 5:
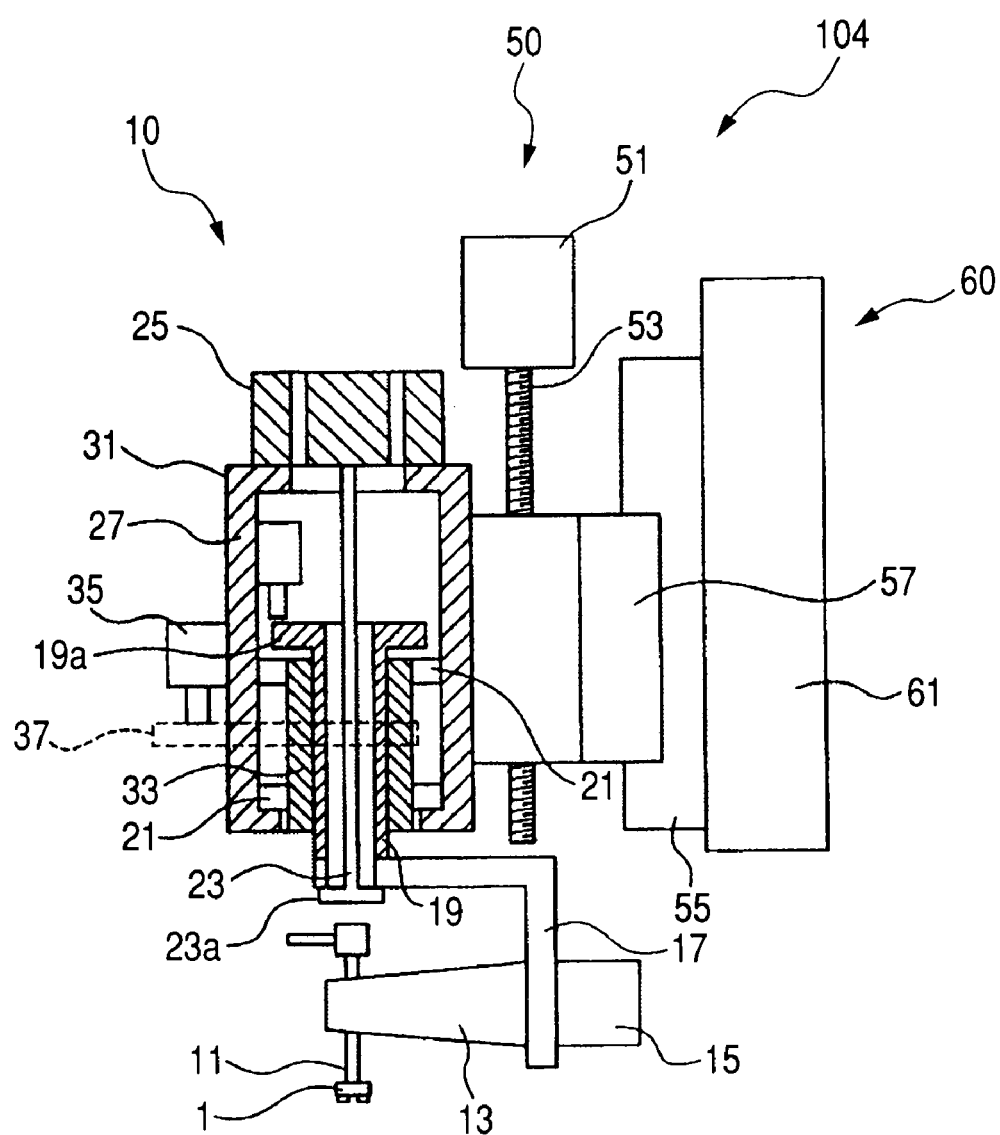
FIG. 5 is a side view of principal part, showing schematic configuration of a mounting apparatus according to a fifth embodiment of the present invention.

A fifth embodiment of the present invention will be described next. FIG. 5 shows an ultrasonic mounting apparatus 104 according to the fifth embodiment in the same format as in FIG. 1. Incidentally, in the present embodiment, components which operate in the same manner as corresponding components of the first embodiment are only indicated in the figure by reference numerals and detailed description thereof will be omitted. Only components different from those of the first to fourth embodiments will be described in detail. Also, the condition regarding the length of the bonding tool prescribed in relation to the standing wave in the first embodiment applies as it is to the present embodiment. According to the present embodiment, an engaging part 23a which spreads outward is formed at or near the lower end of the pressing shaft 23. The engaging part 23a abuts, from below, the underside of that linear portion of the L-shaped horn support member 17 which extends in the Y-axis direction and thereby supports, from below, the horn support member 17 and members which operate by being coupled to the horn support member 17. That is, according to the present embodiment, the engaging part 23a functions as urging means which counteracts the gravity acting on the turning member 19, horn support member 17, transducer 15, ultrasonic horn 13, and bonding tool 11. Although the turning member 19, horn support member 17, transducer 15, ultrasonic horn 13, and bonding tool 11 are supported by the pressing shaft 23 which is a drive shaft of the driving means 25, the driving means 25 is acted upon substantially in the same manner as by the pressing shaft 23 alone.

Even when the pressing shaft 23 extends downward along the Z-axis direction, separating the engaging part 23a from the horn support member 17, causing the lower end of the pressing shaft 23 to abut the upper end of the bonding tool 11, and thereby applying a load to the bonding tool 11, the applied load does not act in any way on the ultrasonic horn 13 and the like. The ultrasonic horn 13 only moves up and down according to the load applied to the bonding tool 11. Also, since no excessive load is applied to the ultrasonic horn 13, regarding the load transmitted from the ultrasonic horn 13 and the like to the to-be-mounted part via the bonding tool 11, it is necessary simply to take into consideration only the weight of the components involved. The load here almost does not contain moment such as described above. This makes it possible to perform a bonding operation using a simple configuration by minimizing any load other than the load supplied by the driving means 25. Also, components used in a driven object to exert drag on the load (driving force) can be eliminated, making it possible to control the load applied to the to-be-mounted part more easily and precisely than possible with conventional techniques such as cited in Related Background Art.

Figure 6:
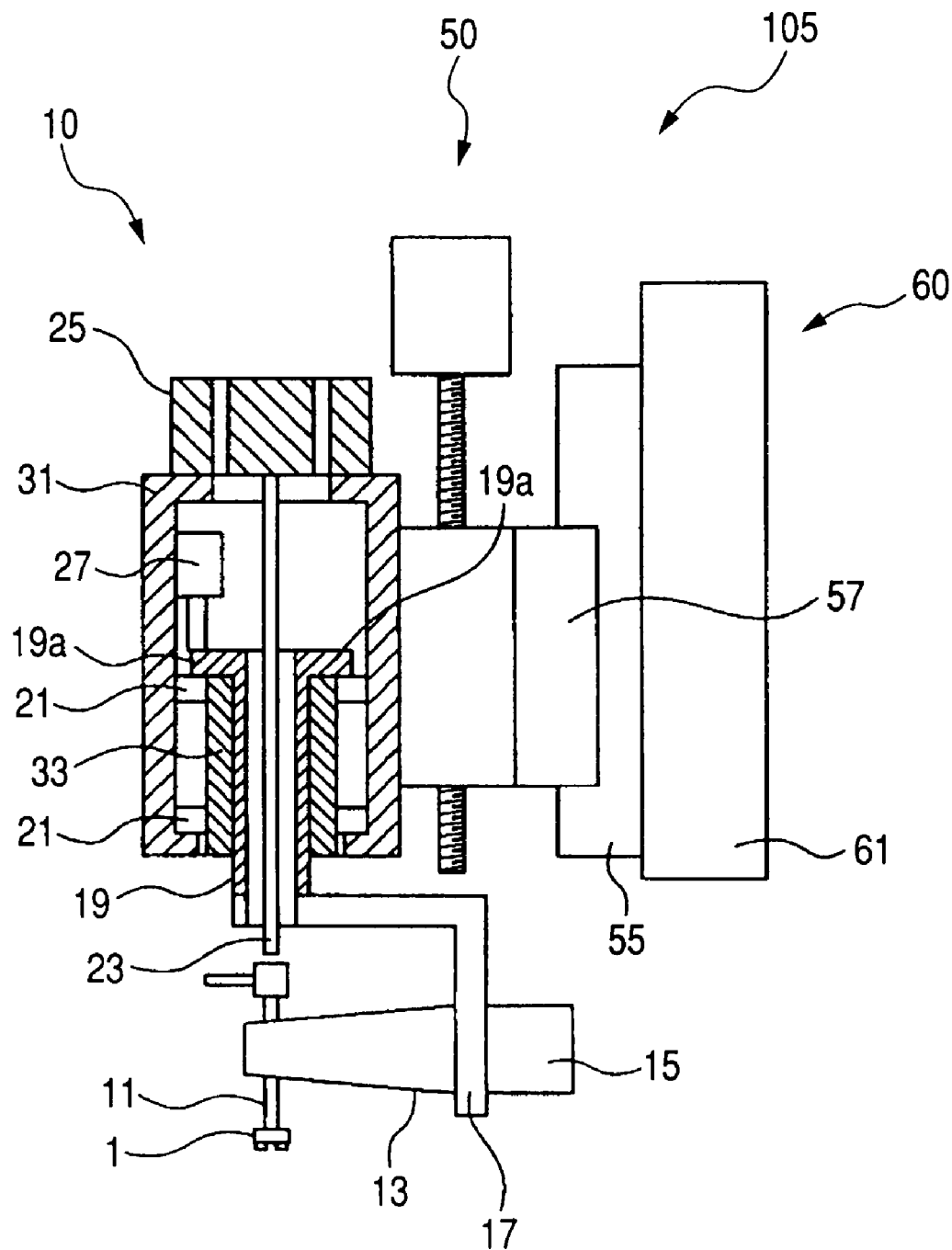
FIG. 6 is a side view of principal part, showing schematic configuration of a mounting apparatus according to another embodiment which is an expansion of the present invention.

An expansion of the present invention is shown in FIG. 6. FIG. 6 shows an ultrasonic mounting apparatus 105 according to the present embodiment in the same format as in FIG. 1. Incidentally, in the present embodiment, components which operate in the same manner as corresponding components of the first embodiment are only indicated in the figure by reference numerals and detailed description thereof will be omitted. Only components different from those of the first to fifth embodiments will be described in detail. Also, the condition regarding the length of the bonding tool prescribed in relation to the standing wave in the first embodiment applies as it is to the present embodiment. According to the present embodiment, there is no component that corresponds to the urging means 29, and the turning member 19, horn support member 17, transducer 15, ultrasonic horn 13, and bonding tool 11 are configured to be movable in the Z-axis direction independently of the slide block 31, driving means 25 and pressing shaft 23. Since there is no engaging part 23a such as the one according to the fifth embodiment, it is not possible to support the turning member 19 against gravity.

However, since the pressing shaft 23 is installed independently, even when the pressing shaft 23 extends downward along the Z-axis direction, causing the lower end of the pressing shaft 23 to abut the upper end of the bonding tool 11 and thereby applying a load to the bonding tool 11, the applied load does not act in any way on the ultrasonic horn 13 and the like. Also, since no excessive load is applied to the ultrasonic horn 13, regarding the load transmitted from the ultrasonic horn 13 and the like to the to-be-mounted part via the bonding tool 11, it is necessary simply to take into consideration only the weight of the components involved. The load here almost does not contain moment such as described above. This makes it possible to perform a bonding operation using a simple configuration by minimizing any load other than the load supplied by the driving means 25.

As described above, the present invention can be suitably applied to a mounting apparatus used to mount electronic parts such as IC chips on a substrate in a flip-chip bonding process. However, the present invention can be applied not only to the flip-chip bonding process, but also to various types of bonding process which involve bonding electrodes in a chip to electrodes on a substrate by applying a load in the direction of the substrate and further applying ultrasonic vibration along a direction different from the direction of application of the load.

As many apparently widely different embodiments of the present invention can be made without departing from the spirit and scope thereof, it is to be understood that the invention is not limited to the specific embodiment thereof except as defined in the appended claims.

What is claimed is:

1. An ultrasonic mounting apparatus which bonds an electrode of an electronic part to be mounted to a wiring electrode on a substrate by pressing the electrode against the wiring electrode with a load applied along a predetermined application axis and applying ultrasonic vibration to the electrode, the ultrasonic vibration having a directional component different from the predetermined application axis, the ultrasonic mounting apparatus comprising:

a bonding tool which, being placed along the predetermined application axis, supports the electronic part at a lower end along the predetermined application axis;

a transducer which generates the ultrasonic vibration;

an ultrasonic horn which, extending in a direction different from the direction of the predetermined application axis, holding the bonding tool at one end, and being connected to the transducer at the other end, transmits the ultrasonic vibration to the bonding tool;

a horn support member which supports the ultrasonic horn;

a turning member that rotates about the predetermined application axis, the turning member being connected to the bonding tool at a lower end portion thereof in the predetermined application axis, and which supports the bonding tool;

a bearing member which supports components including the horn support member, the ultrasonic horn, the transducer, and the bonding tool as integral components in conjunction with the horn support member and allows movement of the components only in a direction along the predetermined application axis;

a driving member which generates a driving force along the predetermined application axis; and a pressing shaft which, extending along the predetermined application axis and through an inside of the turning member and being connected at one end to the driving member, abuts the other end against an upper end of the bonding tool and presses the bonding tool independently of the turning member and the components and thereby transmits the driving force generated by the driving member to the bonding tool, wherein a contact point between the upper end of the bonding tool and the pressing shaft is located at a node of a standing wave generated from the ultrasonic vibration transmitted to the bonding tool, and wherein the driving member relatively drives the pressing shaft with respect to the turning member along the predetermined application axis, and the other end of the pressing shaft can make contact with and be separated from the upper end of the bonding tool by the driving member.

2. The ultrasonic mounting apparatus according to claim 1, further comprising an urging member which produces drag so as to counteract gravity acting on the components.

3. The ultrasonic mounting apparatus according to claim 1, further comprising a locking member which can temporarily restrict movement of the components along the predetermined application axis.

4. The ultrasonic mounting apparatus according to claim 1, wherein
   the horn support member comprises a cylindrical region extending in the direction of the predetermined application axis around the predetermined application axis; and
   the bearing member is a linear bearing which supports an outer periphery of the cylindrical region.

5. The ultrasonic mounting apparatus according to claim 1, wherein the turning member is connected to the bonding tool via the horn support member and the ultrasonic horn, is connected to the horn support member at the lower end portion thereof in the predetermined application axis, and supports the bonding tool.

* * * * *